US008728618B2

(12) United States Patent
Isogai et al.

(10) Patent No.: US 8,728,618 B2
(45) Date of Patent: May 20, 2014

(54) COATING COMPOSITION FOR METAL THIN FILM AND PHOTOLUMINESCENT COATING FILM FORMED FROM SAME

(75) Inventors: Takashi Isogai, Saitama (JP); Mitsuo Najima, Tokyo (JP); Noboru Ohara, Saitama (JP); Masao Watanabe, Koshigaya (JP); Kenji Kawai, Koga (JP); Shuhei Kawabata, Saitama (JP)

(73) Assignee: Fujikura Kasei Co., Ltd., Tokyo (JP)

( * ) Notice: Subject to any disclaimer, the term of this patent is extended or adjusted under 35 U.S.C. 154(b) by 399 days.

(21) Appl. No.: 12/602,671

(22) PCT Filed: Jun. 24, 2008

(86) PCT No.: PCT/JP2008/061456
§ 371 (c)(1),
(2), (4) Date: Dec. 2, 2009

(87) PCT Pub. No.: WO2009/001818
PCT Pub. Date: Dec. 31, 2008

(65) Prior Publication Data
US 2010/0203325 A1 Aug. 12, 2010

(30) Foreign Application Priority Data

Jun. 26, 2007 (JP) ................. 2007-167495

(51) Int. Cl.
*B32B 5/00* (2006.01)
*B32B 27/40* (2006.01)
*B05D 3/06* (2006.01)
*C09D 4/02* (2006.01)
*C09D 175/14* (2006.01)

(52) U.S. Cl.
USPC ............ 428/336; 428/425.8; 428/425.9; 427/496; 427/517; 106/287.25; 522/140; 522/144

(58) Field of Classification Search
USPC ............ 428/425.8, 425.9, 336; 427/496, 517; 106/287.25; 522/140, 144
See application file for complete search history.

(56) References Cited

U.S. PATENT DOCUMENTS

| 433,296 | A | | 7/1890 | Lupton |
| 4,555,472 | A | * | 11/1985 | Katagiri et al. ........... 430/270.18 |
| 4,587,201 | A | * | 5/1986 | Morikawa et al. ......... 430/284.1 |
| 5,322,861 | A | * | 6/1994 | Tsuge et al. .................... 522/90 |
| 5,989,778 | A | * | 11/1999 | Hozumi ..................... 430/281.1 |
| 6,139,933 | A | * | 10/2000 | Van Wijk ..................... 428/64.1 |
| 6,440,519 | B1 | * | 8/2002 | Takase et al. ................ 428/65.2 |
| 6,943,202 | B2 | | 9/2005 | Zhu et al. |
| 7,132,460 | B2 | * | 11/2006 | Fujimoto et al. ................ 522/14 |
| 2001/0046644 | A1 | * | 11/2001 | Ukachi et al. .............. 430/281.1 |
| 2004/0010049 | A1 | * | 1/2004 | Takahashi et al. ................ 522/6 |
| 2005/0175818 | A1 | | 8/2005 | Kawabata et al. |
| 2005/0239916 | A1 | | 10/2005 | Day et al. |
| 2006/0079659 | A1 | | 4/2006 | Flosbach et al. |
| 2006/0210722 | A1 | | 9/2006 | Lunzer et al. |
| 2009/0054544 | A1 | * | 2/2009 | Isogai et al. ................... 522/109 |
| 2010/0221552 | A1 | * | 9/2010 | Ishida et al. ................ 428/423.1 |

FOREIGN PATENT DOCUMENTS

| EP | 1413608 A1 | 4/2004 |
| EP | 2003173 A1 * | 12/2008 |
| JP | 61-021117 A | 1/1986 |
| JP | 09-156034 | 6/1997 |
| JP | 09-324135 | 12/1997 |
| JP | 10245467 | 9/1998 |
| JP | 11-005270 | 1/1999 |
| JP | 11012495 A | 1/1999 |
| JP | 2001323005 A | 11/2001 |
| JP | 2001329030 A | 11/2001 |
| JP | 2002-069138 | 3/2002 |
| JP | 2002-212500 | 7/2002 |
| JP | 2002-219771 | 8/2002 |
| JP | 2002230831 A | 8/2002 |
| JP | 2002-265858 | 9/2002 |
| JP | 2002285083 A | 10/2002 |
| JP | 2003119231 A | 4/2003 |
| JP | 2003-192980 | 7/2003 |
| JP | 2003-292881 | 10/2003 |
| JP | 2004217879 A | 8/2004 |
| JP | 2005-171154 | 6/2005 |
| JP | 2006-169308 | 6/2006 |
| JP | 2007-503491 | 2/2007 |
| TW | 200526701 A | 8/2005 |
| WO | 97/46627 | 12/1997 |
| WO | 0009620 A1 | 2/2000 |
| WO | 2005021614 A1 | 3/2005 |
| WO | 2007003462 A1 | 1/2007 |
| WO | 2007116704 A1 | 10/2007 |

OTHER PUBLICATIONS

Japanese Patent Office; Search Report and Written Opinion in International Patent Application No. PCT/JP2008/061456 dated Jul. 29, 2008.
European Search Report issued in European Patent Application No. 08765800.1 dated Jun. 8, 2012, 6 pages.
Notice of Reasons for Rejection issued in Japanese Patent Application No. 2009-520592; May 28, 2013; 4 pages.
Official Action issued in Japanese Patent Application No. 2009-520592, dated Jun. 19, 2012, 5 pages.
Chinese Patent Office, Office Action issued in Application No. 200780011202.4, mailed Aug. 3, 2011, 12 pp.
European Patent Office, Search Report issued in Application No. 07739818.8, mailed Jun. 29, 2012, 5 pp.

(Continued)

*Primary Examiner* — Thao T. Tran
(74) *Attorney, Agent, or Firm* — Wood, Herron & Evans, LLP

(57) ABSTRACT

A coating composition for a metal thin film for coating a vapor-deposited film or sputtered film provided on the surface of a base material, comprising: a coating film forming component containing 50% by weight or more of urethane(meth) acrylate that is a reaction product of hydrogenated xylene diisocyanate and/or hydrogenated diphenylmethane diisocyanate, polyol, and (meth)acrylate having a hydroxyl group.

17 Claims, No Drawings

(56) References Cited

OTHER PUBLICATIONS

Japanese Patent Office, Search Report and Written Opinion issued in Application No. PCT/JP2007/056380, mailed Jun. 26, 2007, 11 pp.
Taiwanese Patent Office, Office Action issued in Application No. 096110447, mailed Nov. 10, 2010, 11 pp.
U.S. Patent and Trademark Office, Final Office Action issued in U.S. Appl. No. 12/294,579, mailed Nov. 29, 2013, 11 pp.
U.S. Patent and Trademark Office, Non-Final Office Action issued in U.S. Appl. No. 12/294,579, mailed May 9, 2013, 12 pp.
U.S. Patent and Trademark Office, Final Office Action issued in U.S. Appl. No. 12/294,579, mailed Nov. 23, 2012, 12 pp.
U.S. Patent and Trademark Office, Final Office Action issued in U.S. Appl. No. 12/294,579, mailed Mar. 18, 2010, 35 pp.
U.S. Patent and Trademark Office, Non-Final Office Action issued in U.S. Appl. No. 12/294,579, mailed Aug. 4, 2009, 37 pp.

* cited by examiner

COATING COMPOSITION FOR METAL THIN FILM AND PHOTOLUMINESCENT COATING FILM FORMED FROM SAME

TECHNICAL FIELD

The present invention relates to a coating composition for a metal thin film that is preferably used for coating vapor-deposited film or sputtered film, and to a photoluminescent coating film formed thereby.

BACKGROUND ART

Metal thin films are formed on the surfaces of building materials, vehicle parts and the like in order to impart a favorable appearance or a sense of high quality. Known examples of methods for forming metal thin films include vapor deposition and sputtering. In addition, chrome and chrome alloys are frequently used as metals for forming a metal thin film, and allow the obtaining of a superior appearance in the sense of high quality.

A coating film is normally provided in the form of a topcoat on the surfaces of such metal thin films, and serves to protect the surface of the metal thin film or impart an attractive appearance thereto.

Known coatings for forming a coating film consist of heat-curable powder coating compositions and heat-curable liquid agent-type coatings.

For example, Patent Document 1 discloses a method for providing a topcoat layer by coating a urethane-based topcoat coating onto a metal thin film layer of a base material composed of a soft resin material on which is sequentially provided a base coat layer and a metal thin film layer, and then heat curing the topcoat coating by baking.

In addition, Patent Document 2 discloses a method for providing a topcoat layer by baking a urethane-based topcoat coating incorporating a silane coupling agent having epoxy groups onto a metal thin film layer of a base material composed of a soft resin material on which is sequentially provided a base coat layer and a metal thin film layer.

Moreover, Patent Document 3 discloses a method for forming a transparent resin coating film (topcoat) by baking a coating composed of an acrylic resin and a melamine resin onto a thin film in a metal or resin material having a resin coating film formed on the surface of a metal or resin material, a thin film of a titanium alloy having a chrome-plated appearance formed on the resin coating film, and a transparent resin coating film formed in the form of a protective layer on the thin film.

However, in a method in which a coated film is formed by baking a coating on a metal thin film as described in Patent Documents 1 to 3, a considerable amount of time for coating work was required, thereby resulting in low productivity.

Therefore, coatings (active energy beam-curable coatings) have been proposed that contain active energy beam-curable components such as ultraviolet ray-curable components, which are cured with the progression of a polymerization reaction induced by ultraviolet light, since they enable work time to be shortened and have superior mechanical properties.

However, active energy beam-curable coatings were subject to the occurrence of curing shrinkage of the coating film (cured product) when cured by being irradiated with an active energy beam such as ultraviolet light. The occurrence of curing shrinkage causes cracks to form in metal thin films coated by the coating film, resulting in increased susceptibility to a decrease in adhesion between the coating film and the metal thin film. Susceptibility to decreased adhesion was particularly great in the case of metal thin films formed by vapor deposition or sputtering.

As an example of a coating that solves the aforementioned problems, Patent Document 4 discloses a photocurable coating composition for metal vapor deposition top coating that contains an acrylic polymer, a radial polymerizable compound containing urethane acrylate, for example, and a photoinitiator. In addition, a method is also described for curing a coating composition by coating the photocurable coating composition for metal vapor deposition top coating onto a metal vapor deposition surface followed by irradiating with ultraviolet light.

However, in the photocurable coating composition for metal vapor deposition top coating described in Patent Document 4, although initial adhesion and scratch resistance were favorable, there were cases in which the composition was unable to impart superior water resistance, rust prevention and alkaline resistance to a metal thin film.

[Patent Document 1] Japanese Unexamined Patent Application, First Publication No. H9-156034
[Patent Document 2] Japanese Unexamined Patent Application, First Publication No. H11-5270
[Patent Document 3] Japanese Unexamined Patent Application, First Publication No. 2002-219771
[Patent Document 4] Japanese Unexamined Patent Application, First Publication No. 2006-169308

DISCLOSURE OF THE INVENTION

Problems to be Solved by the invention

With the foregoing in view, an object of the present invention is to realize a coating composition for a metal thin film that forms a coated film that has superior adhesion with a metal thin film formed by vapor deposition or sputtering and is able to impart high levels of water resistance, rust prevention, alkaline resistance and scratch resistance to the metal thin film, and a photoluminescent coating film formed thereby.

Means for Solving the Problems

As a result of conducting extensive studies, the inventors of the present invention found that by using urethane(meth)acrylate having an alicyclic structure in particular by selecting from among numerous types of urethane acrylates as a component of a coating composition, together with having superior adhesion with respect to a metal thin film, a coated film can be formed that imparts high levels of water resistance, rust prevention, alkaline resistance and scratch resistance to the metal thin film, thereby leading to completion of the present invention.

Namely, a first aspect of the present invention in the form of a coating composition for a metal thin film is a coating composition for a metal thin film for coating a vapor-deposited film or sputtered film provided on the surface of a base material, comprising: a coating film forming component containing 50% by weight or more of urethane(meth)acrylate that is a reaction product of hydrogenated xylene diisocyanate and/or hydrogenated diphenylmethane diisocyanate, polyol, and (meth)acrylate having a hydroxyl group.

Here, the coating film forming component preferably contains 50 to 95% by weight of the urethane(meth)acrylate, 0 to 30% by weight of an active energy beam-curable component (excluding urethane(meth)acrylate), and 1 to 20% by weight of a silane coupling agent having epoxy and/or vinyl groups.

In addition, the active energy beam-curable component preferably contains 10% by weight or more of an active energy beam-curable component having an alicyclic structure.

Moreover, the composition preferably contains 1 to 20 parts by weight of a photopolymerization initiator based on a total of 100 parts by weight of the urethane(meth)acrylate and the active energy beam-curable component.

In addition, the photoluminescent coating film of the present invention is a photoluminescent coating film formed by coating the aforementioned coating composition for a metal thin film on a metal thin film provided on the surface of a base material composed of metal or resin, wherein the metal thin film is provided on the surface of the base material by vapor deposition or sputtering, and has a thickness of 15 to 100 nm.

Moreover, the metal of the metal thin film is preferably chrome or a chrome alloy.

A second aspect of the present invention in the form of the use of a coating composition for a metal thin film comprises the use of a coating composition for a metal thin film for coating a vapor-deposited or sputtered film in the form of a metal thin film provided on the surface of a base material, containing 50% by weight or more of urethane(meth)acrylate that is the reaction product of hydrogenated xylene diisocyanate and/or hydrogenated diphenylmethane diisocyanate, polyol and (meth)acrylate having a hydroxyl group.

A third aspect of the present invention in the form of a production method of a photoluminescent coating film is a production method of a photoluminescent coating film, comprising:

a step for providing a vapor-deposited film or sputtered film in the form of a metal thin film on the surface of a base material to a thickness of 15 to 100 nm, a step for preparing a coating composition that contains a coating film forming component containing 50% by weight or more of urethane(meth)acrylate that is the reaction product of hydrogenated xylene diisocyanate and/or hydrogenated diphenylmethane diisocyanate, polyol, and (meth)acrylate having a hydroxyl group, a step for coating the coating composition onto the metal thin film so that the coating film thickness after curing is to 5 to 100 μm, and a step for curing the coated coating composition by irradiating with an active energy beam.

Effects of the Invention

According to the coating composition for a metal thin film of the present invention, a coated film can be formed that has superior adhesion with a metal thin film formed by vapor deposition or sputtering, and imparts a high level of water resistance, rust prevention, alkaline resistance and scratch resistance to the metal thin film.

In addition, according to the present invention, a photoluminescent coating film is obtained that demonstrates favorable adhesion between a metal thin film and a coated film, and has superior water resistance, rust prevention, alkaline resistance and scratch resistance.

BEST MODE FOR CARRYING OUT THE INVENTION

The following provides a detailed explanation of the present invention.

[Coating Composition for Metal Thin Film]

The coating composition for a metal thin film of the present invention (to be referred to as the "coating composition") forms a coated film that imparts water resistance, rust prevention, alkaline resistance and scratch resistance to a metal thin film by coating onto a metal thin film (a vapor-deposited film or sputtered film) such as that made of aluminum, iron, nickel, chrome, copper, silver or alloy thereof, and curing by irradiating with an active energy beam.

This coating composition contains a coating film forming component that contains 50% by weight or more of urethane (meth)acrylate having an alicyclic structure.

Furthermore, in the present invention, "(meth)acrylate" refers to one or both of methacrylate and acrylate.

<Coating Film Forming Component>
(Urethane(Meth)acrylate)

The urethane(meth)acrylate used in the present invention is a reaction product of hydrogenated xylene diisocyanate and/or hydrogenated diphenylmethane diisocyanate, polyol, and (meth)acrylate having a hydroxyl group.

Although urethane(meth)acrylate is normally obtained by reacting a polyisocyanate compound, polyol and (meth)acrylate having a hydroxyl group, urethane(meth)acrylate having an alicyclic structure is obtained by using an isocyanate compound having an alicyclic structure, namely hydrogenated xylene diisocyanate and/or hydrogenated diphenylmethane diisocyanate, for the polyisocyanate compound as in the present invention. A coating composition that contains such urethane(meth)acrylate is able to form a coated film that demonstrates superior adhesion with metal thin films and is able to impart high levels of water resistance, rust prevention, alkaline resistance and scratch resistance to metal thin films. In the case of using a polyisocyanate compound other than hydrogenated xylene diisocyanate and/or hydrogenated diphenylmethane diisocyanate, even if a coated film having superior adhesion and scratch resistance is able to be formed initially, there are cases in which adhesion decreases to the presence of moisture, and rust prevention also tends to decrease as a result thereof.

Furthermore, the hydrogenated xylene diisocyanate and hydrogenated diphenylmethane diisocyanate are commercially available.

Examples of polyols include polyether polyols such as polyethylene glycol, polypropylene glycol or polytetramethylene glycol, polyvalent alcohols such as ethylene glycol, propylene glycol, 1,6-hexanediol, neopentylglycol, trimethylolpropane or pentaerythritol, polyester polyols obtained by reaction of polyvalent alcohol and polybasic acid such as adipic acid, polycarbonate polyols, 1,4-cyclohexanediol and 2,2-r-bis(4-hydroxycyclohexyl) propane. 1,6-hexanediol is particularly preferable. One type of these polyols may be used alone or two or more types may be used in combination.

Examples of (meth)acrylate monomers having a hydroxyl group include 2-hydroxyethyl(meth)acrylate, 2-hydroxypropyl(meth)acrylate, glycerol di(meth)acrylate, polyethylene glycol(meth)acrylate, pentaerythritol tri(meth)acrylate, dipentaerythritol penta(meth)acrylate, caprolactone-modified 2-hydroxyethyl(meth)acrylate and caprolactone-modified pentaerythritol tri(meth)acrylate. 2-hydroxyethyl(meth)acrylate is particularly preferable. One type of these (meth)acrylate monomers having a hydroxyl group may be used alone or two or more types may be used in combination.

Urethane(meth)acrylate having an alicyclic structure is obtained by reacting the aforementioned hydrogenated xylene diisocyanate and/or hydrogenated diphenylmethane diisocyanate (which may be referred to as "polyisocyanate compounds having an alicyclic structure") with polyol, and reacting (meth)acrylate monomer having a hydroxyl group with the resulting product. At this time, although the equivalent ratio between the polyisocyanate compounds having an alicyclic structure, the polyol and the (meth)acrylate monomer having a hydroxyl group is determined stoichiometrically, they are preferably used at a ratio of the polyisocyanate compounds having an alicyclic structure to the polyol to the (meth)acrylate monomer having a hydroxyl group of, for example, about 1:1.1 to 2.0:0.1 to 1.2. In addition, a known catalyst can be used in the reaction.

The content of the urethane(meth)acrylate is 50% by weight or more in 100% by weight of the coating film forming component. If the content of the urethane(meth)acrylate is less than 30% by weight, adhesion to a metal thin film decreases and it becomes difficult to impart water resistance, rust prevention and alkaline resistance to the metal thin film.

Furthermore, since the coating composition of the present invention comprises a coating film forming component that contains 50% by weight or more of urethane(meth)acrylate, a molded article coated with the coating composition is resistant to discoloration and has superior weather resistance even if allowed to stand outdoors.

Although the coating film forming component may be composed of only the aforementioned urethane(meth)acrylate, an active energy beam-curable component (excluding the aforementioned urethane(meth)acrylate) may be contained for the purpose of further enhancing the hardness of the coated film formed or providing an inexpensive coating composition, or a silane coupling agent may be contained to enhance adhesion to a metal thin film. Furthermore, although the ratio of the coating film forming component to the coating composition can be selected as necessary, it is preferably 40 to 98% by weight, more preferably 50 to 95% by weight, and even more preferably 75 to 95% by weight.

In the case the coating film forming component contains an active energy beam-curable component or silane coupling agent, the content of the urethane(meth)acrylate is preferably 50 to 95% by weight, more preferably 60 to 95% by weight, and preferably 70 to 90% by weight. If the content of the urethane(meth)acrylate is within the above ranges, adhesion with a metal thin film is superior and high levels of water resistance, rust prevention, alkaline resistance and scratch resistance can be imparted to the metal thin film.

(Active Energy Beam-Curable Component)

Examples of active energy beam-curable components include compounds having one or more (meth)acryloyl groups in a molecule thereof.

The content of the active energy beam-curable component in 100% by weight of the coating film forming component is preferably 0 to 30% by weight, more preferably 10 to 30% by weight, and particularly preferably 15 to 25% by weight. Although effects of the present invention are adequately demonstrated even if an active energy beam-curable component is not contained therein, if the content of the active energy beam-curable component is within the above ranges, hardness can be further enhanced while maintaining adhesion, water resistance, rust prevention and other properties of the coated film formed.

In addition, in the present invention, an active energy beam-curable component having an alicyclic structure within a molecule thereof is contained in 100% by weight of the active energy beam-curable component preferably at 10% by weight or more, more preferably at 10 to 30% by weight, and particularly preferably at 15 to 25% by weight. Containing an active energy beam-curable component having an alicyclic structure in a molecule thereof makes it possible to further improve adhesion with a metal thin film as well as further enhance water resistance, rust prevention and the like.

Examples of compounds having one (meth)acryloyl group in a molecule thereof include methyl(meth)acrylate, ethyl (meth)acrylate, n-butyl(meth)acrylate, t-butyl(meth)acrylate, benzyl(meth)acrylate, ethoxyethyl(meth)acrylate, butoxyethyl(meth)acrylate, hydroxyethyl(meth)acrylate, cyclohexyl(meth)acrylate, t-butylcyclohexyl(meth)acrylate, dicyclohexylpentanyl(meth)acrylate, tricyclodecanedimethanol(meth)acrylate and isoboronyl(meth)acrylate.

Among those compounds having one (meth)acryloyl group in a molecule thereof, those having an alicyclic structure are preferable, and more specifically, cyclohexyl(meth)acrylate, t-butylcyclohexyl(meth)acrylate, dicyclohexylpentanyl(meth)acrylate, tricyclodecanedimethanol(meth)acrylate and isoboronyl(meth)acrylate are particularly preferable.

Examples of compounds having two (meth)acryloyl groups in a molecule thereof include ethylene glycol di(meth)acrylate, diethylene glycol di(meth)acrylate, triethylene glycol di(meth)acrylate, tetraethylene glycol di(meth)acrylate, 2-(meth)acryloyloxyethyl acid phosphate, 1,4-butanediol di(meth)acrylate, 1,6-hexanediol di(meth)acrylate, 1,9-nonanediol di(meth)acrylate, glycerin di(meth)acrylate, neopentylglycol di(meth)acrylate, 3-methyl-1,5-pentanediol di(meth)acrylate, 2-butyl-2-ethyl-1,3-propanediol di(meth)acrylate, dimethylol tricyclodecane di(meth)acrylate, propylene glycol di(meth)acrylate, dipropylene glycol di(meth)acrylate, tripropylene glycol di(meth)acrylate, tetrapropylene glycol di(meth)acrylate, neopentylglycol hydroxypivalate di(meth)acrylate, 1,3-butanediol di(meth)acrylate and dimethylol dicyclopentane di(meth)acrylate.

Among these, diethylene glycol di(meth)acrylate, dimethylol tricyclodecane di(meth)acrylate, dipropylene glycol di(meth)acrylate and dimethylol dicyclopentane di(meth) acrylate are preferable, while dimethylol tricyclodecane di(meth)acrylate and dimethylol dicyclopentane di(meth)acrylate having an alicyclic structure are more preferable.

Compounds having three or more (meth)acryloyl groups in a molecule thereof are able to further enhance the hardness of the coated film formed. Specific examples of such compounds include tris(2-hydroxyethyl)isocyanurate tri(meth)acrylate, trimethylolpropane tri(meth)acrylate, pentaerythritol tri(meth)acrylate, propoxified trimethylolpropane tri (meth)acrylate, ethoxified trimethylolpropane tri(meth)acrylate, dimethylolpropane tetra(meth)acrylate, pentaerythritol tetra(meth)acrylate, propoxified pentaerythritol tetra(meth)acrylate, epoxified pentaerythritol tetra(meth)acrylate, dipentaerythritol hexa(meth)acrylate and tris(acryloxyethyl) isocyanurate.

Among these, trimethylolpropane tri(meth)acrylate and dipentaerythritol hexa(meth)acrylate are preferable.

For the active energy beam-curable component, one type of a compound having one or more (meth)acryloyl groups in a molecule thereof as exemplified above may be used alone, or two or more types of such compounds may be used in combination. In addition, in the case of using a compound having an alicyclic structure, adhesion with a metal thin film is improved and water resistance, rust prevention and the like are further enhanced as previously described, thereby making this preferable. One type of compound having an alicyclic structure may be used alone or two or more types may be used in combination. Moreover, improved adhesion with a metal thin film and further enhancement of rust prevention and the like can be expected even in the case of using in combination with other compounds not having an alicyclic structure.

As has been previously described, the urethane(meth)acrylate contained in the coating film forming component is urethane(meth)acrylate synthesized from a polyisocyanate compound having an alicyclic structure (hydrogenated xylene diisocyanate and/or hydrogenated diphenylmethane diisocyanate). However, if a coating film forming component is prepared from only urethane(meth)acrylate synthesized from polyisocyanate compounds having an alicyclic structure, the coating composition that is produced becomes relatively expensive since this type of urethane(meth)acrylate is expensive.

Therefore, it is preferable to combine the use of a comparatively inexpensive active energy beam-curable component in order to provide a less expensive coating composition that still maintains high levels of adhesion, water resistance, rust prevention and the like.

With respect to the aforementioned active energy beam-curable component in general, in the case a monofunctional or bifunctional active energy beam-curable component having an alicyclic structure is contained in the coating film forming component, the adhesion, water resistance, rust prevention and so forth of the coating film formed can be enhanced. In addition, in the case of containing a trifunctional or more active energy beam-curable component in the coating film forming component, the topcoat performance of the coating film formed (coated film) can be enhanced, thereby making this particularly preferable in the case of providing the coated film in the form of a topcoat.

Namely, in the case of preparing the coating film forming component by combining the aforementioned urethane (meth)acrylate synthesized from a polyisocyanate compound having an alicyclic structure and an active energy beam-curable component in the form of a monofunctional or bifunctional active energy beam-curable component and/or trifunctional or more active energy beam-curable component, an inexpensive coating composition can be produced that maintains high levels of adhesion, water resistance, rust prevention, topcoat performance and the like of the coating film formed.

(Silane Coupling Agent)

Examples of silane coupling agents include vinyl trimethoxysilane, vinyl triethoxysilane, 3-acryloxypropyl trimethoxysilane, allyl trimethoxysilane, allyl triethoxysilane, 3-glycidoxypropyl trimethoxysilane, γ-glycidoxypropyl trimethoxysilane, γ-glycidoxypropyl triethoxysilane, γ-glycidoxypropylmethyl dimethoxysilane, γ-glycidoxypropylmethyl diethoxysilane, γ-methacryloxypropyl trimethoxysilane, γ-methacryloxypropyl triethoxysilane, γ-methacryloxypropylmethyl dimethoxysilane, γ-methacryloxypropylmethyl diethoxysilane, N-(β-aminoethyl)-γ-aminopropyl trimethoxysilane, N-(β-aminoethyl)-γ-aminocropyl triethoxysilane, N-(β-aminoethyl)-γ-aminopropylmethyl dimethoxysilane and N-(β-aminoethyl)-γ-aminopropylmethyl diethoxysilane. Among these, those having an ethoxy group (glycidyl group) and/or vinyl group are used preferably, and more specifically, 3-acryloxypropyl trimethoxysilane and 3-glycidoxypropyl trimethoxysilane are particularly preferable. One type of these silane coupling agents may be used alone or two or more types may be used in combination.

The content of the silane coupling agent in 100% by weight of the coating film forming component is preferably 1 to 20% by weight, more preferably 3 to 15% by weight and particularly preferably 4 to 12% by weight. If the content of the silane coupling agent is within the above ranges, adhesion between a metal thin film and a coated film is further enhanced.

(Thermoplastic Resin)

The coating film forming component may further contain a thermoplastic resin for improving fluidity of the coating composition. Examples of thermoplastic resins include (meth) acrylic resins such as homopolymers in the manner of poly (methyl methacrylate), poly(ethyl methacrylate), poly(butyl methacrylate) or poly(2-ethylhexyl methacrylate), or copolymers thereof. Among these, poly(methyl methacrylate) is preferable.

The thermoplastic resin is added corresponding to the application of the resulting coating composition, and the content thereof in 100% by weight of the coating film forming component is preferably 0 to 15% by weight and more preferably 0 to 10% by weight. Although effects of the present invention are adequately demonstrated even in the case of not containing a thermoplastic resin, if the content of the thermoplastic resin is within the above ranges, fluidity of the coating composition can be further improved while retaining adhesion, water resistance, rust prevention and other properties of the coated film formed.

<Other Components>

A photopolymerization initiator is normally contained in the coating composition in addition to the coating film forming resin component described above. Examples of commercially available photopolymerization initiators include Irgacure 184, Irgacure 149, Irgacure 651, Irgacure 907, Irgacure 754, Irgacure 819, Irgacure 500, Irgacure 1000, Irgacure 1800 or Irgacure 754 (manufactured by Ciba Specialty Chemicals Inc.) Lucirin TPO (manufactured by BASF) and Kayacure DETX-S, Kayacure EPA or Kayacure DMBI (manufactured by Nippon Kayaku Co., Ltd.). One type of these photopolymerization initiators may be used alone or two or more types may be used in combination.

In addition, a photosensitizer or photoaccelerator may be used in combination with the photopolymerization initiator.

The content of the photopolymerization initiator based on a total of 100 parts by weight of the urethane(meth)acrylate and active energy beam-curable component is preferably 1 to 20 parts by weight, more preferably 1 to 15 parts by weight and even more preferably 2 to 10 parts by weight. If the content of the photopolymerization initiator is within the above ranges, adequate crosslinking density is obtained.

The coating composition may also contain various types of solvents as necessary. Examples of solvents include hydrocarbon-based solvents such as toluene, xylene, solvent naphtha, methylcyclohexane or ethylcyclohexane; ester-based solvents such as ethyl acetate, butyl acetate or ethylene glycol monomethyl ether acetate; and ketone-based solvents such as acetone, methyl ethyl ketone, methyl isobutyl ketone or diisobutyl ketone. One type of these solvents may be used alone or two or more types may be used in combination.

In addition, the coating composition may also contain suitable amounts of additives ordinarily used in coatings, such as ultraviolet absorbers, antioxidants, radical capturers, surface conditioners, plasticizers or pigment anti-settling agents.

The coating composition can be prepared by mixing the coating film forming component, containing the aforementioned urethane(meth)acrylate as well as an active energy beam-curable component, silane coupling agent and thermoplastic resin as necessary, with arbitrary components such as a photopolymerization initiator, solvent or various types of additives.

The coating composition prepared in this manner can then be coated onto a metal thin film by a method such as spray coating, brush coating, roller coating, curtain coating, flow coating or dip coating so that the coating film thickness after curing is about 5 to 100 μm, followed by irradiating with ultraviolet light at about 100 to 3000 mJ (measured value as determined with the "UVR-N1" manufactured by Japan Storage Battery Co., Ltd.) for about 1 to 10 minutes using a fusion lamp, high-pressure mercury lamp or metal halide lamp and the like to form a coated film.

The active energy beam can be selected as necessary, and an electron beam or gamma rays and the like can be used in addition to ultraviolet light.

[Average Molecular Weight Between Crosslinking Points]

The average molecular weight between crosslinking points of the urethane(meth)acrylate and active energy beam-curable component in the present invention is preferably 150 to 1500, more preferably 200 to 1000, even more preferably 200 to 600, and particularly preferably 200 to 500. If the average molecular weight between crosslinking points is 150 or more, the coating film formed does not become unnecessarily hard and is resistant to separation from a metal thin film. On the other hand, if the average molecular weight between crosslinking points is 1500 or less, the coating film formed is not unnecessarily soft and is able to maintain scratch resistance. This effect is even better if the average molecular weight between crosslinking points is 600 or less.

The average molecular weight between crosslinking points is determined in the following manner in the present invention. Molecular weights between crosslinking points are determined by dividing the molecular weight of each monomer that composes the coating film forming component, with the exception of the silane coupling agent, by the number of functional groups of the monomer. The value obtained by converting to molecular weights between crosslinking points corresponding to the ratio of the monomer to the entire component followed by totaling those molecular weights is then used as the average molecular weight between crosslinking points.

[Photoluminescent Coating Film]

Although the coating composition of the present invention is preferable for coating a metal thin film, it is particularly suitable for coating a vapor-deposited film or sputtered film. Reasons for this include its high transparency, superior adhesion to metal, and its resistance to the occurrence of cracking and separation of the metal thin film due to its extremely low level of curing shrinkage. In addition, the coating composition of the present invention is also preferable for a topcoat of a metal thin film. Metal thin films are formed by providing a base coat layer as necessary on the surface of a base material followed by vapor deposition or sputtering. Specific examples of materials used for the base material include metals such as aluminum, iron, brass or copper, and resins such as ABS, PC or PP.

Furthermore, there are no particular limitations on the coating that forms the base coat layer provided it demonstrates favorable adhesion to the base material, and may be a heat-curable coating or an active energy beam-curable coating.

Although examples of materials of a metal thin film include aluminum, iron, nickel, chrome, copper, silver and alloys thereof, the coating composition of the present invention demonstrates superior adhesion with respect to aluminum and chrome in particular, and is able to impart high levels of water resistance, rust prevention, alkaline resistance and scratch resistance thereto.

In addition, the thickness of a metal thin film provided on the surface of a base material is preferably 15 to 100 nm, more preferably 30 to 80 nm and even more preferably 40 to 60 nm. If the thickness of the metal thin film is 15 nm or more, reflectance does not decrease and a sense of luster tends to be adequate. On the other hand, if the thickness of the metal thin film is 100 nm or less, the thin metal film is resistance to the occurrence of cracking and separation.

A photoluminescent coating film demonstrating favorable adhesion between a metal thin film and a coated film and having superior water resistance, rust prevention, alkaline resistance and scratch resistance is obtained by coating the surface of the metal thin film using the coating composition of the present invention to provide a coated film on the surface of the metal thin film.

If chrome is used for the material of the metal thin film in particular, a photoluminescent coating film is obtained that has high light reflectance, is resistant to corrosion and demonstrates a sense of high quality.

There are no particular limitations on the applications of such a photoluminescent coating film, and examples of such applications include building materials such as aluminum sashes, automobile and other vehicle parts and various other applications.

Furthermore, if a coated film formed by the coating composition of the present invention is coating a metal thin film, it may be provided as a top coat of the uppermost layer or may be provided as an intermediate layer. In the case of providing as an intermediate layer, a top clear layer and the like composed of a heat-cured top clear coating such as an acrylic lacquer coating, acrylic melamine-cured clear coating or aluminum chelate-cured acrylic coating may be formed as necessary on the coated film.

Since the coating composition explained above contains a coating film forming component that contains urethane (meth)acrylate that is the reaction product of hydrogenated xylene diisocyanate and/or hydrogenated diphenylmethane diisocyanate, polyol and (meth)acrylate having a hydroxyl group, a coating film can be formed that demonstrates superior adhesion to a metal thin film and is able to impart high levels of water resistance, rust prevention, alkaline resistance and scratch resistance to the metal thin film.

In addition, since this coating composition is an active energy beam-curable, the amount of time required for curing is shorter than that of heat-curable coatings, thereby enabling the formation of a coated film with good productivity.

EXAMPLES

Although the following provides a more detailed explanation of the present invention through examples thereof, the present invention is not limited thereto.

Synthesis of Urethane(Meth)acrylates A to D

Synthesis Example 1

59 parts by weight of 1,6-hexanediol (Ube Industries) and 194 parts by weight of hydrogenated xylene diisocyanate (Mitsui Takeda Chemicals) were charged into a 500 ml flask equipped with a stirrer and a thermometer followed by reacting for 4 hours at 70° C. Next, 116 parts by weight of 2-hydroxyethyl acrylate (Kyoei Chemical), 0.6 parts by weight of hydroquinone and 0.3 parts by weight of dibutyltin dilaurate were further added to the flask followed by reacting for 5 hours at 70° C. while bubbling air through the contents of the flask to obtain urethane(meth)acrylate A.

Synthesis Example 2

Urethane(meth)acrylate B was obtained in the same manner as Synthesis Example 1 with the exception of changing the 194 parts by weight of hydrogenated xylene diisocyanate to 262 parts by weight of hydrogenated diphenylmethane diisocyanate (Sumitomo Bayer Urethane).

Synthesis Example 3

Urethane(meth)acrylate C was obtained in the same manner as Synthesis Example 1 with the exception of changing the 194 parts by weight of hydrogenated xylene diisocyanate to 222 parts by weight of isophorone diisocyanate (Degussa Japan).

Synthesis Example 4

Urethane(meth)acrylate D was obtained in the same manner as Synthesis Example 1 with the exception of changing the 194 parts by weight of hydrogenated xylene diisocyanate to 168 parts by weight of hexamethylene diisocyanate (Nippon Polyurethane Industry).

[Formation of Metal Thin Film]

<Sputtering Method—Chrome Sputtered Film>

Formation Example 1

ABS Base Material

A UV-curable base coat coating (Fujikura Kasei, "Fujihard VB2979U-42") was spray-coated onto the surface of an ABS sheet with a spray gun to a coating film thickness after curing of 15 μm. Next, ultraviolet light at 300 mJ (value measured with the "UVR-N1" manufactured by Japan Storage Battery Co., Ltd.) was radiated from a high-pressure mercury lamp for 2 to 3 minutes to form a base coat layer. Next, a chrome metal material was sputtered onto the base coat layer using a sputtering system ("CFS-8ES", Tokuda Seisakusho) to form a chrome thin film (chrome sputtered film). The thickness of the chrome sputtered film was 50 nm.

Formation Example 2

Aluminum Base Material

A chrome sputtered film was formed on a base material in the same manner as Formation Example 1 with the exception of changing the base material from an ABS sheet to an aluminum sheet, and using the UV-curable base coat coating Fujihard VB7654U-N8 (Fujikura Kasei). The thickness of the chrome sputtered film was 50 nm.

<Vapor Deposition Method—Aluminum Vapor-Deposited Film>

Formation Example 3

ABS Base Material

A base coat layer was formed on the surface of an ABS sheet in the same manner as Formation Example 1. Next, an aluminum thin film (aluminum vapor-deposited film) was formed by vapor-depositing an aluminum metal material on the base coat layer using a vapor deposition system ("EX-200", Ulvac). The thickness of the aluminum vapor-deposited film was 80 nm.

Example 1

A liquid coating composition was prepared by mixing each component at the solid content ratios (weight ratios) shown in Table 1.

Next, the resulting coating composition was spray-coated onto the surface of a metal thin film formed using the forming method (formation example) shown in Table 1 with a spray gun so that the coating film thickness after curing was 20 μm. Next, after drying the solvent under conditions of 80° C. for 3 minutes, ultraviolet light of 300 mJ (measured value as determined with the "UVR-N1" manufactured by Japan Storage Battery Co., Ltd.) was radiated from a high-voltage mercury lamp for 2 to 3 minutes to form a coated film that was used as a test piece.

The test piece obtained in this manner was evaluated for initial adhesion, water resistance, rust prevention, alkaline resistance and scratch resistance (pencil hardness) as indicated below. The results are shown in Table 1.

<Evaluation>

(Evaluation of Initial Adhesion)

Cuts were made in the coating film of the test piece (coated film) at a width of 1 mm in the form of a 10×10 grid pattern with a cutter, and tape was affixed to the portion of the grid pattern and then peeled off to evaluate initial adhesion according to the following evaluation criteria.

Furthermore, cellophane tape (registered trademark) was used for the tape.

○: No separation of coating film
Δ: Separation of corners of coating film
X: Separation of one or more squares of the coating film (Evaluation of Water Resistance)

After immersing the test piece in warm water at 40° C. for 24 hours and 240 hours, cuts were made in the coating film (coated film) at a width of 1 mm in the form of a 10×10 grid pattern with a cutter, and tape was affixed to the portion of the grid pattern and then peeled off to evaluate adhesion according to the following evaluation criteria. Furthermore, cellophane tape (registered trademark) was used for the tape.

○: No separation of coating film even after immersing for 240 hours
Δ: No separation of coating film after immersing for 24 hours
X: Separation of one or more squares of the coating film after immersing for 24 hours (Evaluation of Rust Prevention)

A rust prevention test was carried out under conditions of 12 hours and 120 hours in compliance with JIS H8681-2 using a CASS tester ("SQ-800-CA", Itabashi Rika Kogyo). A test piece was then examined visually for the presence of rust and evaluated according to the following evaluation criteria.

○: Rust not confirmed even after 120 hours of rust prevention test
Δ: Rust not confirmed after 12 hours of rust prevention test
X: Rust confirmed in 12 hour rust prevention test (Evaluation of Alkaline Resistance)

After immersing a test piece in 0.1 N aqueous sodium hydroxide solution for 24 hours, the appearance was evaluated visually according to the following evaluation criteria.

○: No abnormalities confirmed
X: Abnormalities confirmed (Evaluation of Scratch Resistance (Pencil Hardness))

Pencil hardness of the coating film (coated film) was measured in compliance with JIS K 5600 and evaluated according to the following evaluation criteria.

○: Pencil hardness of 3H or more
Δ: Pencil hardness of H to 2H
X: Pencil hardness of less than H Examples 2 to 14 and Comparative Examples 1 to 13

Liquid coating compositions were prepared by mixing each of the components at the solid content ratios (weight ratios) shown in Tables 1 to 4. Test pieces were produced and evaluated in the same manner as Example 1 with the exception of using the resulting liquid compositions. The results are shown in Tables 1 to 4.

Furthermore, descriptions of the components in the tables are as indicated below.
(1) Diethylene glycol diacrylate: Daicel-Cytec Co., Ltd.
(2) Cyclohexyl acrylate: NOF Corp.
(3) Trimethylolpropane triacrylate: Nippon Kayaku Co., Ltd.
(4) Dipentaerythritol hexaacrylate: Nippon Kayaku Co., Ltd.
(5) Tris-isocyanurate triacrylate: Toagosei Co., Ltd.
(6) Dipropylene glycol diacrylate: Daicel-Cytec Co., Ltd.
(7) 3-glycidoxypropyl trimethoxysilane: Shin-Etsu Chemical Co., Ltd.
(8) 3-acryloxypropyl trimethoxysilane: Dow Corning Toray Co., Ltd.
(9) Poly(methyl methacrylate): "Acrybase LH101", Fujikura Kasei Co., Ltd., solid fraction content: 40% by weight
(10) Irgacure 184: Ciba Specialty Chemicals Inc.
(11) Irgacure 819: Ciba Specialty Chemicals Inc.

In addition, the values for molecular weight between crosslinking points of the urethane(meth)acrylates A to D and active energy beam-curable components used in the examples and comparative examples are as indicated below.

|   |   | Molecular Weight | No. of Functional Groups | Molecular Weight Between Crosslinking Points |
|---|---|---|---|---|
| (1) | Urethane (meth)acrylate A | 738 | 2 | 369 |
| (2) | Urethane (meth)acrylate B | 874 | 2 | 437 |
| (3) | Urethane (meth)acrylate C | 794 | 2 | 397 |
| (4) | Urethane (meth)acrylate D | 686 | 2 | 343 |
| (5) | Diethylene glycol diacrylate | 214 | 2 | 107 |
| (6) | Cyclohexyl acrylate | 154 | 1 | 154 |
| (7) | Trimethylolpropane triacrylate | 296 | 3 | 99 |
| (8) | Dipentaerythritol hexaacrylate | 578 | 6 | 96 |
| (9) | SHIKOH UV3520B (Nippon Synthetic Chemical Industry) | 14000 | 2 | 7000 |
| (10) | Tris-isocyanurate triacrylate | 423 | 3 | 141 |
| (11) | Dipropylene glycol diacrylate | 242 | 2 | 121 |

Average molecular weight between crosslinking points can be calculated using the following formula in the case of using the example of Examples 3 and 4.

Example 3 ((1): 50%, (2): 50%)

$$369 \times 0.5 + 107 \times 0.5 = 238$$

Example 4 ((1): 50%, (5): 40%, (6): 10%)

$$369 \times 0.5 + 107 \times 0.4 + 154 \times 0.1 = 243$$

TABLE 1

| | | | Examples | | | | | | |
|---|---|---|---|---|---|---|---|---|---|
| | | | 1 | 2 | 3 | 4 | 5 | 6 | 7 |
| Coating film forming component | | Urethane (meth)acrylate A | 100 | | 50 | 50 | 100 | 50 | 50 |
| | | Urethane (meth)acrylate B | | 100 | | | | | |
| | Active energy beam-curable component | Diethylene glycol diacrylate | | | 50 | 40 | | | |
| | | Cyclohexyl acrylate | | | | 10 | | | |
| | | Trimethylolpropane triacrylate | | | | | | 50 | |
| | | Dipentaerythritol hexaacrylate | | | | | | | 50 |
| | | SHIKOH UV3520B | | | | | | | |
| | Silane coupling agent | 3-glycidoxypropyl trimethoxysilane | | | | | | | |
| | | 3-acryloxypropyl trimethoxysilane | | | | | | | |
| | Thermoplastic resin | Poly(methyl methacrylate) | | | | | 10 | | |
| Photopolymerization initiator | | Irgacure 184 | 3 | 3 | 3 | 3 | 3 | 3 | 3 |
| | | Irgacure 819 | | | | | | | |
| Solvent | | Ethyl acetate | 50 | 50 | 50 | 40 | 100 | 50 | 50 |
| Average molecular weight between crosslinking points | | | 369 | 437 | 238 | 243 | 369 | 234 | 233 |
| Metal thin film formation method (Formation Example*[1]) | | | 1 | 1 | 1 | 1 | 1 | 1 | 1 |
| Evaluation | | Initial adhesion | ○ | ○ | ○ | ○ | ○ | ○ | ○ |
| | | Water resistance | Δ | Δ | Δ | ○ | Δ | Δ | Δ |
| | | Rust prevention | Δ | Δ | Δ | Δ | Δ | Δ | Δ |
| | | Alkaline resistance | ○ | ○ | ○ | ○ | ○ | ○ | ○ |
| | | Scratch resistance (pencil hardness) | ○ | ○ | ○ | ○ | ○ | ○ | ○ |

*[1]Formation Example 1 (ABS sheet, Cr-sputtered film), Formation Example 2 (Al plate-Cr-sputtered film), Formation Example 3 (ABS sheet, Al vapor-deposited film)

TABLE 2

| | | | Examples | | | | | | | | |
|---|---|---|---|---|---|---|---|---|---|---|---|
| | | | 8 | 9 | 10 | 11 | 12 | 13 | 14 | 15 | 16 |
| Coating film forming component | | Urethane (meth)acrylate A | 80 | 80 | 80 | 80 | 100 | 95 | 85 | 100 | 100 |
| | | Urethane (meth)acrylate B | | | | | | | | | |
| | Active energy beam-curable component | Diethylene glycol diacrylate | | | | | | | | | |
| | | Cyclohexyl acrylate | | | | | | | | | |
| | | Trimethylolpropane triacrylate | 20 | 20 | 20 | 20 | | | | | |
| | | Dipentaerythritol hexaacrylate | | | | | | | | | |
| | | SHIKOH UV3520B | | | | | | 5 | | 15 | |
| | Silane coupling agent | 3-glycidoxypropyl trimethoxysilane | 4 | 8 | 12 | | | | | | |
| | | 3-acryloxypropyl trimethoxysilane | | | | 6 | | | | | |
| | Thermoplastic resin | Poly(methyl methacrylate) | | | | | | | | | |
| Photopolymerization initiator | | Irgacure 184 | 3 | 3 | 3 | 3 | | 3 | 3 | 3 | 3 |
| | | Irgacure 819 | | | | | 3 | | | | |
| Solvent | | Ethyl acetate | 50 | 50 | 50 | 50 | 50 | 50 | 50 | 50 | 50 |
| Average molecular weight between crosslinking points | | | 315 | 315 | 315 | 315 | 369 | 701 | 1364 | 369 | 369 |
| Metal thin film formation method (Formation Example*[1]) | | | 1 | 1 | 1 | 1 | 1 | 1 | 1 | 2 | 3 |
| Evaluation | | Initial adhesion | ○ | ○ | ○ | ○ | ○ | ○ | ○ | ○ | ○ |
| | | Water resistance | ○ | ○ | ○ | ○ | Δ | Δ | Δ | Δ | ○ |
| | | Rust prevention | ○ | ○ | ○ | ○ | Δ | Δ | Δ | Δ | Δ |
| | | Alkaline resistance | ○ | ○ | ○ | ○ | ○ | ○ | ○ | ○ | ○ |
| | | Scratch resistance (pencil hardness) | ○ | ○ | ○ | ○ | ○ | ○ | Δ | ○ | ○ |

TABLE 3

| | | | Comparative Examples | | | | | | |
|---|---|---|---|---|---|---|---|---|---|
| | | | 1 | 2 | 3 | 4 | 5 | 6 | 7 |
| Coating film forming component | | Urethane (meth)acrylate A | | | | | | | |
| | | Urethane (meth)acrylate B | 100 | 100 | | | | | |
| | | Urethane (meth)acrylate D | | | 100 | | | | |
| | Active energy beam-curable component | Tris-isocyanurate triacrylate | | | | 100 | | | |
| | | Diethylene glycol diacrylate | | | | | 100 | | |
| | | Dipropylene glycol diacrylate | | | | | | 100 | |
| | | Trimethylolpropane triacrylate | | | | | | | 100 |
| | | Dipentaerythritol hexaacrylate | | | | | | | |
| | Silane coupling agent | 3-glycidoxypropyl trimethoxysilane | | | | | | | |
| | | 3-acryloxypropyl trimethoxysilane | | | | | | | |
| | Thermoplastic resin | Poly(methyl methacrylate) | | 10 | | | | | |
| Photopolymerization initiator | | Irgacure 184 | 3 | 3 | 3 | 3 | 3 | 3 | 3 |
| | | Irgacure 819 | | | | | | | |
| Solvent | | Ethyl acetate | 50 | 100 | 50 | 50 | 50 | 50 | 50 |
| Average molecular weight between crosslinking points | | | 397 | 397 | 343 | 141 | 107 | 121 | 99 |
| Metal thin film formation method (Formation Example*[1]) | | | 1 | 1 | 1 | 1 | 1 | 1 | 1 |
| Evaluation | | Initial adhesion | ○ | ○ | ○ | X | X | X | X |
| | | Water resistance | X | X | X | X | X | X | X |
| | | Rust prevention | X | X | X | X | X | X | X |
| | | Alkaline resistance | X | X | X | X | X | X | X |
| | | Scratch resistance (pencil hardness) | ○ | ○ | ○ | ○ | X | X | ○ |

*[1]Formation Example 1 (ABS sheet, Cr-sputtered film), Formation Example 2 (Al plate-Cr-sputtered film), Formation Example 3 (ABS sheet, Al vapor-deposited film)

TABLE 4

| | | | Comparative Examples | | | | | |
|---|---|---|---|---|---|---|---|---|
| | | | 8 | 9 | 10 | 11 | 12 | 13 |
| Coating film forming component | | Urethane (meth)acrylate A | | | | | | 20 |
| | | Urethane (meth)acrylate B | | | | | | |
| | | Urethane (meth)acrylate D | | | | | | |
| | Active energy beam-curable component | Tris-isocyanurate triacrylate | | | | | | |
| | | Diethylene glycol diacrylate | | | | | | |
| | | Dipropylene glycol diacrylate | | | | | | |
| | | Trimethylolpropane triacrylate | | | | | | |

TABLE 4-continued

| | | Comparative Examples | | | | | |
|---|---|---|---|---|---|---|---|
| | | 8 | 9 | 10 | 11 | 12 | 13 |
| | Dipentaerythritol hexaacrylate | 100 | 100 | 100 | 100 | 100 | 80 |
| Silane coupling agent | 3-glycidoxypropyl trimethoxysilane | | 10 | | 10 | 10 | 10 |
| | 3-acryloxypropyl trimethoxysilane | | | 10 | | | |
| Thermoplastic resin | Poly(methyl methacrylate) | | | | | | |
| Photopolymerization initiator | Irgacure 184 | | 3 | 3 | 3 | 3 | 3 |
| | Irgacure 819 | 3 | | | | | |
| Solvent | Ethyl acetate | 50 | 50 | 50 | 50 | 50 | 50 |
| Average molecular weight between crosslinking points | | 96 | 96 | 96 | 96 | 96 | 151 |
| Metal thin film formation method (Formation Example*1) | | 1 | 1 | 1 | 3 | 2 | 1 |
| Evaluation | Initial adhesion | X | Δ | Δ | Δ | ○ | ○ |
| | Water resistance | X | X | X | X | X | X |
| | Rust prevention | X | X | X | X | X | X |
| | Alkaline resistance | X | X | X | X | X | X |
| | Scratch resistance (pencil hardness) | ○ | ○ | ○ | ○ | ○ | ○ |

As is clear from Tables 1 to 4, according to the examples, coated films were able to be formed which, together with having superior adhesion to a metal thin film, demonstrated favorable water resistance, rust prevention and alkaline resistance and were provided with a high level of scratch resistance.

On the other hand, in Comparative Examples 1 to 3, in which a polyisocyanate compound other than hydrogenated xylene diisocyanate or hydrogenated diphenylmethane diisocyanate was used in synthesis of urethane(meth)acrylate, although initial adhesion and scratch resistance were superior, water resistance, rust prevention and alkaline resistance were inferior to those of the examples.

In addition, the coating compositions that did not contain urethane(meth)acrylate (Comparative Examples 3 to 12) were unable to form coated films provided with all of the properties of adhesion, water resistance, rust prevention, alkaline resistance and scratch resistance.

Furthermore, although Comparative Example 13, in which hydrogenated xylene diisocyanate was used in synthesis of urethane(meth)acrylate, demonstrated superior initial adhesion and scratch resistance since it incorporated a small amount of urethane(meth)acrylate, water resistance, rust prevention and alkaline resistance were inferior to those of the examples.

INDUSTRIAL APPLICABILITY

A coating composition for a metal thin film, which forms a coated film that demonstrates superior adhesion to a metal thin film formed by vapor deposition or sputtering and is able to impart high levels of water resistance, rust prevention, alkaline resistance and scratch resistance to the metal thin film, and a photoluminescent coating film formed thereby, were realized.

The invention claimed is:

1. A coating composition, comprising:
a coating film forming component that consists of a urethane(meth)acrylate and a photopolymerization initiator,
wherein
the urethane(meth)acrylate is a reaction product of hydrogenated xylene diisocyanate and/or hydrogenated diphenylmethane diisocyanate,
polyol selected from the group consisting of polyether polyols, polyvalent alcohols, polyester polyols, 1,4-cyclohexanediol, and 2,2'-bis(4-hydroxycyclohexyl) propane, and
(meth)acrylate having a hydroxyl group,
wherein the polyvalent alcohols are selected from the group consisting of ethylene glycol, propylene glycol, 1,6-hexanediol, neopentylglycol, trimethylolpropane, and pentaerythritol, and
the average molecular weight between crosslinking points of the urethane(meth)acrylate is 150 to 1500, or the average molecular weight between crosslinking points of the urethane(meth)acrylate and active energy beam-curable component is 150 to 1500 when the active energy beam-curable component is included in the coating composition.

2. The coating composition according to claim 1, wherein 1 to 20 parts by weight of the photopolymerization initiator is included based on a total of 100 parts by weight of the urethane(meth)acrylate.

3. The coating composition according to claim 1, wherein the equivalent ratio between the hydrogenated xylene diisocyanate and/or hydrogenated diphenylmethane diisocyanate, the polyol, and the (meth)acrylate monomer having a hydroxyl group is 1:1.1 to 2.0:0.1 to 1.2.

4. The coating composition according to claim 1, wherein the coating composition is a topcoat coating composition.

5. The coating composition according to claim 1, wherein the polyether polyol is selected from the group consisting of polyethylene glycol, polypropylene glycol, and polytetramethylene glycol, and the polyester polyols is obtained by reaction of the polyvalent alcohol and adipic acid.

6. The coating composition according to claim 1, wherein the polyol is selected from the group consisting of polyethylene glycol, polypropylene glycol, polytetramethylene glycol, ethylene glycol, propylene glycol, 1,6-hexanediol, neopentylglycol, trimethylolpropane, pentaerythritol, 1,4-cyclohexanediol, and 2,2'-bis(4-hydroxycyclohexyl) propane.

7. The coating composition according to claim 1, wherein the polyol is selected from the group consisting of polyethylene glycol, 1,6-hexanediol, trimethylolpropane, 1,4-cyclohexanediol, and 2,2'-bis(4-hydroxycyclohexyl) propane.

8. The coating composition according to claim 1, wherein the polyol is 1,6-hexanediol.

9. The coating composition according to claim 1, wherein the coating composition further comprises a solvent.

10. The coating composition according to claim 1, wherein the ratio of the coating film forming component to the coating composition is 40% to 98% by weight.

11. The coating composition according to claim 1, wherein the average molecular weight between crosslinking points is 200 to 1000.

12. A photoluminescent coating film comprising:
a base material composed of metal or resin,
a metal thin film, and
a coating film which is a topcoat,
wherein the metal thin film is provided on the surface of the base material by vapor deposition or sputtering, and has a thickness of 15 to 100 nm, and
the coating film is formed by coating the metal thin film with the coating composition according to claim 1.

13. The photoluminescent coating film according to claim 12, wherein the metal of the metal thin film is chrome or a chrome alloy.

14. The photoluminescent coating film according to claim 12, wherein the photoluminescent coating film is a dried film that is obtained by coating the coating composition on the metal thin film by a method selected from spray coating, brush coating, roller coating, curtain coating, flow coating, or dip coating.

15. Method for producing a photoluminescent coating film, comprising:
a step for providing a vapor-deposited film or sputtered film in the form of a metal thin film on the surface of a base material to a thickness of 15 to 100 nm,
a step for preparing a coating composition that contains a coating film forming component that consists of a photopolymerization initiator and a urethane(meth)acrylate, wherein the urethane(meth)acrylate is the reaction product of
hydrogenated xylene diisocyanate and/or hydrogenated diphenylmethane diisocyanate,
polyol selected from the group consisting of polyether polyols, polyvalent alcohols, polyester polyols, 1,4-cyclohexanediol, and 2,2'-bis(4-hydroxycyclohexyl) propane, and
(meth)acrylate having a hydroxyl group,
wherein the polyvalent alcohols are selected from the group consisting of ethylene glycol, propylene glycol, 1,6-hexanediol, neopentylglycol, trimethylolpropane, and pentaerythritol,
a step for coating the coating composition onto the metal thin film so that the coating film thickness after curing is 5 to 100 μm, and
a step for curing the coated coating composition by irradiating with an active energy beam to obtain a cured film which is a topcoat.

16. The method for producing a photoluminescent coating film according to claim 15, wherein the step for coating the coating composition onto the metal thin film is performed by a method selected from spray coating, brush coating, roller coating, curtain coating, flow coating, or dip coating.

17. The method for producing a photoluminescent coating film according claim 15, wherein the equivalent ratio between the hydrogenated xylene diisocyanate and/or hydrogenated diphenylmethane diisocyanate, the polyol, and the (meth) acrylate monomer having a hydroxyl group is 1:1.1 to 2.0:0.1 to 1.2.

* * * * *